(12) United States Patent
Ito

(10) Patent No.: US 6,927,148 B2
(45) Date of Patent: Aug. 9, 2005

(54) ION IMPLANTATION METHOD AND METHOD FOR MANUFACTURING SOI WAFER

(75) Inventor: Hiroyuki Ito, Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 192 days.

(21) Appl. No.: 10/619,193

(22) Filed: Jul. 14, 2003

(65) Prior Publication Data

US 2004/0038504 A1 Feb. 26, 2004

(30) Foreign Application Priority Data

Jul. 15, 2002 (JP) ..................................... P2002-206038

(51) Int. Cl.$^7$ .......................................... H01L 21/301
(52) U.S. Cl. ...................... 438/458; 438/528; 438/961
(58) Field of Search ................................ 438/458, 528, 438/961, FOR 158; 148/DIG. 12

(56) References Cited

U.S. PATENT DOCUMENTS

| | | | | |
|---|---|---|---|---|
| 5,523,652 | A | 6/1996 | Sferlazzo et al. | ........ 315/111.41 |
| 5,789,744 | A * | 8/1998 | Spence et al. | .............. 250/251 |
| 6,335,535 | B1 * | 1/2002 | Miyake et al. | ......... 250/492.21 |
| 2004/0038505 | A1 * | 2/2004 | Ito et al. | ...................... 438/520 |

FOREIGN PATENT DOCUMENTS

| | | | | |
|---|---|---|---|---|
| JP | 51-119287 | 10/1976 | ............ | H01J/39/35 |
| JP | 52-044155 | 4/1977 | ............ | H01J/3/04 |
| JP | 52-052099 | 4/1977 | ............ | H05H/7/08 |
| JP | 52-054897 | 5/1977 | ............ | H05H/7/08 |
| JP | 52-054898 | 5/1977 | ............ | H05H/7/08 |
| JP | 55-161341 | 12/1980 | ............ | H01J/37/08 |
| JP | 56-097952 | 8/1981 | ............ | H01J/37/08 |
| JP | 60-133646 | 7/1985 | ............ | H01J/37/08 |
| JP | 60-195853 | 10/1985 | ............ | H01J/37/08 |
| JP | 60-195854 | 10/1985 | ............ | H01J/37/08 |
| JP | 60-232652 | 11/1985 | ............ | H01J/37/08 |
| JP | 60-243952 | 12/1985 | ............ | H01J/37/08 |
| JP | 60-243953 | 12/1985 | ............ | H01J/37/08 |
| JP | 60-243955 | 12/1985 | ............ | H01J/37/08 |
| JP | 60-243957 | 12/1985 | ............ | H01J/37/08 |
| JP | 61-007452 | 1/1986 | .......... | G01N/25/16 |
| JP | 61-107643 | 5/1986 | ............ | H01J/37/08 |
| JP | 62-071147 | 4/1987 | ............ | H01J/27/16 |
| JP | 62-086640 | 4/1987 | ............ | H01J/27/16 |
| JP | 62-108441 | 5/1987 | ............ | H01J/37/08 |
| JP | 62-140339 | 6/1987 | ............ | H01J/27/16 |
| JP | 01-128335 | 5/1989 | ............ | H01J/27/02 |
| JP | 04-196032 | 7/1992 | ............ | H01J/27/16 |
| JP | 05-283194 | 10/1993 | ............ | H05H/1/46 |
| JP | 06-036696 | 2/1994 | ............ | H01J/27/18 |
| JP | 06-076775 | 3/1994 | ............ | H01J/37/08 |
| JP | 06-231710 | 8/1994 | ............ | H01J/37/08 |
| JP | 06-267472 | 9/1994 | ............ | H01J/37/08 |
| JP | 09-245705 | 9/1997 | .......... | H01J/37/147 |
| JP | 10-012152 | 1/1998 | ............ | H01J/27/16 |
| JP | 2000-012285 | 1/2000 | ............ | H05H/1/46 |
| JP | 2000/040475 | 2/2000 | ............ | H01J/27/18 |

* cited by examiner

*Primary Examiner*—George Fourson
(74) *Attorney, Agent, or Firm*—Moser, Patterson & Sheridan, L.L.P.

(57) ABSTRACT

Disclosed are an ion implantation method capable of dramatically increasing an implantation rate of hydrogen ions into a semiconductor substrate and a method for manufacturing an SOI wafer, in which manufacturing efficiency of the SOI wafer is sufficiently high. When the hydrogen ions are implanted to a predetermined depth of the semiconductor substrate, hydrogen gas is introduced into a chamber where an inner pressure is reduced and a predetermined magnetic field is formed, plasma is generated by introducing a microwave into the magnetic field, hydrogen ion beams containing hydrogen molecule ions is extracted from the plasma, and the hydrogen molecule ions are irradiated and implanted onto the semiconductor substrate. Thus, a throughput in the hydrogen ion implantation is improved, thus making it possible to enhance the manufacturing efficiency of the SOI wafer.

9 Claims, 4 Drawing Sheets

ION IMPLANTATION METHOD AND METHOD FOR MANUFACTURING SOI WAFER

BACKGROUND OF THE INVENTION

1. Field of the Invention

The present invention relates to an ion implantation method and a method for manufacturing an SOI wafer.

2. Related Background of the Invention

An SOI (Silicon on Insulator) wafer generally refers to a wafer formed into a layered structure of Si layer/insulating layer/Si substrate by forming a thin insulating layer and a single crystal Si layer near the surface of the Si substrate. In recent years, this SOI wafer has gained attention because the SOI wafer is excellent in that integration and operation speed thereof are higher in comparison with those of a usual bulk Si wafer.

As a method for manufacturing the SOI wafer, a smart-cut method has been known (refer to Japanese Patent Laid-Open Publication 2000-12285 and so on). The smart-cut method is one for fabricating the SOI wafer in the following manner. Specifically, hydrogen ions are implanted into a Si substrate through an insulating layer ($SiO_2$ layer or the like) formed on the surface of the Si substrate, and this substrate is bonded to another Si substrate, followed by partition of the bonded substrates at a portion of such a hydrogen ion implanted layer.

In the foregoing smart-cut method, generally, an arc discharge type plasma source using a hot cathode as an ion source is used in the case of implanting the hydrogen ions into the Si substrate. Because the arc discharge type ion source accelerates electrons to a high energy state between an anode and the cathode to ionize gas, this type of ion source is suitable for efficiently generating single atom ions and multivalent ions. Hence, in this case, hydrogen atom ions ($H^+$) generated from the arc discharge type ion source are implanted into the Si substrate.

In order to easily and securely partition the SOI wafer at the portion of the hydrogen ion implanted layer in a process of manufacturing the SOI wafer, it is extremely important to increase an implantation amount of the hydrogen ions into the Si substrate. Preferably, the implantation amount is $5 \times 10^{16}$ ion/cm$^2$ or more. Hence, it is desirable to perform the ion implantation with a high throughput (hydrogen implantation rate into a wafer per unit time).

SUMMARY OF THE INVENTION

However, there are physical limitations on a plasma density in the arc discharge type ion source, and therefore, there is an upper limit on a current density of ion beams of hydrogen atoms extracted as single atom ions, causing constraints on the implantation rate of the hydrogen ions. A typical throughput is 10 wafer/hour or less.

Note that, though it is theoretically possible to increase a beam current of the hydrogen atom ions by enlarging the ion source, the entire apparatus is made unnecessarily larger, accordingly power necessary for the operation of the apparatus is also made larger. Therefore, efficiency thereof is low, and maintenance thereof is also complicated and difficult. Accordingly, no fundamental solution of the foregoing problems is brought.

The present invention has been created in consideration of the foregoing problems inherent in the related art. It is an object of the present invention to provide an ion implantation method capable of efficiently implanting hydrogen ions into a semiconductor substrate, and provide a method for manufacturing an SOI wafer, in which manufacturing efficiency of the SOI wafer is sufficiently high.

In order to solve the foregoing problems, the ion implantation method of the present invention is a method for implanting hydrogen ions to a predetermined depth of a semiconductor substrate, comprising steps of: introducing hydrogen gas into a vacuum chamber where an inner pressure is reduced and a predetermined magnetic field is formed; generating plasma by introducing a microwave into the magnetic field; extracting hydrogen ion beams containing hydrogen molecule ions from the plasma; and irradiating the hydrogen molecule ions onto the semiconductor substrate.

According to the present invention, when the hydrogen gas is introduced into the vacuum chamber where the inner pressure is reduced and the predetermined magnetic field is formed, the plasma is generated by introducing the microwave into the magnetic field. Thus, generation efficiency of the hydrogen molecule ions can be enhanced by use of low-energy electrons in the plasma generation. Moreover, because an extremely high plasma density is achieved, a ratio of the hydrogen molecule ions and a current density in the hydrogen ion beams extracted from the plasma can be improved. Furthermore, the hydrogen ions can be implanted efficiently to the predetermined depth of the semiconductor substrate by irradiating the hydrogen molecule ions in the hydrogen ion beams onto the semiconductor substrate. Thus, a high level throughput becomes realizable in the manufacturing process of the SOI wafer.

In the ion implantation method of the present invention, it is preferable that a frequency of the microwave and an intensity of the magnetic field satisfy conditions represented by any of the following Expressions (1) and (2):

$$\omega > \frac{eB}{2\pi m_e} \quad (1)$$

$$\omega < \frac{eB}{2\pi m_e} \quad (2)$$

where $\omega$ is the frequency of the microwave, $m_e$ is a mass of electrons, e is a charge of the electrons, and B is the intensity of the magnetic field.

Thus, the generation efficiency of the hydrogen molecule ions by the low-energy electrons is further enhanced, and the current density of the hydrogen ion beams and the ratio of the hydrogen molecule ions can be further improved.

In addition, in the ion implantation method of the present invention, it is preferable that a mean residential time of the hydrogen molecules from the introduction of the hydrogen gas into a generation region of the plasma to the extraction of the hydrogen ion beams ranges from $5 \times 10^{-4}$ to $5 \times 10^{-3}$ seconds. Thus, the generation efficiency of the hydrogen molecule ions by the low-energy electrons can be further enhanced, and the current density of the hydrogen ion beams and the ratio of the hydrogen molecule ions can be further improved.

Note that the mean residential time mentioned in the present invention is obtained in accordance with the following Expression (3):

$$\tau = \frac{L}{v_g} \quad (3)$$

where τ is the mean residential time, $v_g$ is a mean velocity of the hydrogen gas molecules introduced into the plasma chamber in the direction where the ions are extracted, L is a mean moving distance of the hydrogen gas molecules from an introduction port of the plasma chamber to an extraction port thereof.

Furthermore, in the ion implantation method of the present invention, it is preferable that one including an insulating layer on a Si substrate is used as the semiconductor substrate, and the hydrogen molecule ions are implanted to a predetermined depth of the Si substrate by irradiating the hydrogen molecule ions from a side of the insulating layer.

In addition, in the ion implantation method of the present invention, it is preferable that one including a $SiO_2$ layer on the Si substrate is used as the semiconductor substrate, and the hydrogen molecule ions are implanted to a predetermined depth of the Si substrate by irradiating the hydrogen molecule ions from a side of the $SiO_2$ layer.

A first method of the present invention for manufacturing an SOI wafer is a method for manufacturing an SOI wafer, comprising: an ion implantation step of forming a hydrogen ion implanted layer to a predetermined depth of a first wafer having an insulating layer on one surface of a Si substrate by the ion implantation method of the present invention; a layering step of obtaining a layered body by layering a second wafer formed of a Si substrate on the insulating layer of the first wafer having been subjected to the ion implantation step; and a partition step of partitioning the layered body at the hydrogen ion implanted layer.

In the foregoing first manufacturing method, the hydrogen ion implanted layer is formed to the predetermined depth of the first wafer (insulating layer/Si substrate), the second wafer is layered on the insulating layer to form the layered body (Si substrate/insulating layer/Si layer/hydrogen ion implanted layer/Si substrate), and this layered body is partitioned at the hydrogen ion implanted layer. Thus, the SOI wafer (Si layer/insulating layer/Si substrate) is obtained. In this case, by applying the ion implantation method of the present invention in the ion implantation step, the hydrogen ions are implanted efficiently to the predetermined depth of the Si substrate, thus making it possible to dramatically improve the throughput. In addition, by performing the ion implantation in this way, the formation of the hydrogen ion implanted layer to a relatively shallow position in the Si substrate from the surface of the insulating layer side can also be achieved easily. Hence, the foregoing manufacturing method is extremely useful in that it is possible to manufacture the SOI wafer efficiently and securely which is excellent in integration.

A second method of the present invention for manufacturing an SOI wafer is a method for manufacturing an SOI wafer, comprising: an ion implantation step of forming a hydrogen ion implanted layer to a predetermined depth of a third wafer formed of a Si substrate; a layering step of obtaining a layered body by layering an insulating layer and a second wafer formed of a Si substrate on a predetermined surface of the third wafer having been subjected to the ion implantation step; and a partition step of partitioning the layered body at the hydrogen ion implanted layer, characterized in that the hydrogen ion implanted layer is formed by the ion implantation method of the present invention.

In the foregoing second manufacturing method, after the hydrogen ion implanted layer is formed on the third wafer formed of the Si substrate, an insulating layer and a fourth wafer are layered on a predetermined surface of the third wafer, and the layered body is partitioned at the hydrogen ion implanted layer. Thus, an SOI wafer (Si layer/insulating layer/Si substrate) is obtained. In this case also, by applying the ion implantation method of the present invention in the ion implantation step, it is possible to manufacture the SOI wafer efficiently and securely which is excellent in integration in a similar way to that of the first manufacturing method.

In each of the first and second manufacturing methods, it is preferable that the insulating layer is a $SiO_2$ layer. Thus, an SOI wafer having a layered structure of Si layer/$SiO_2$ layer/Si substrate is obtained efficiently.

Figure 1:
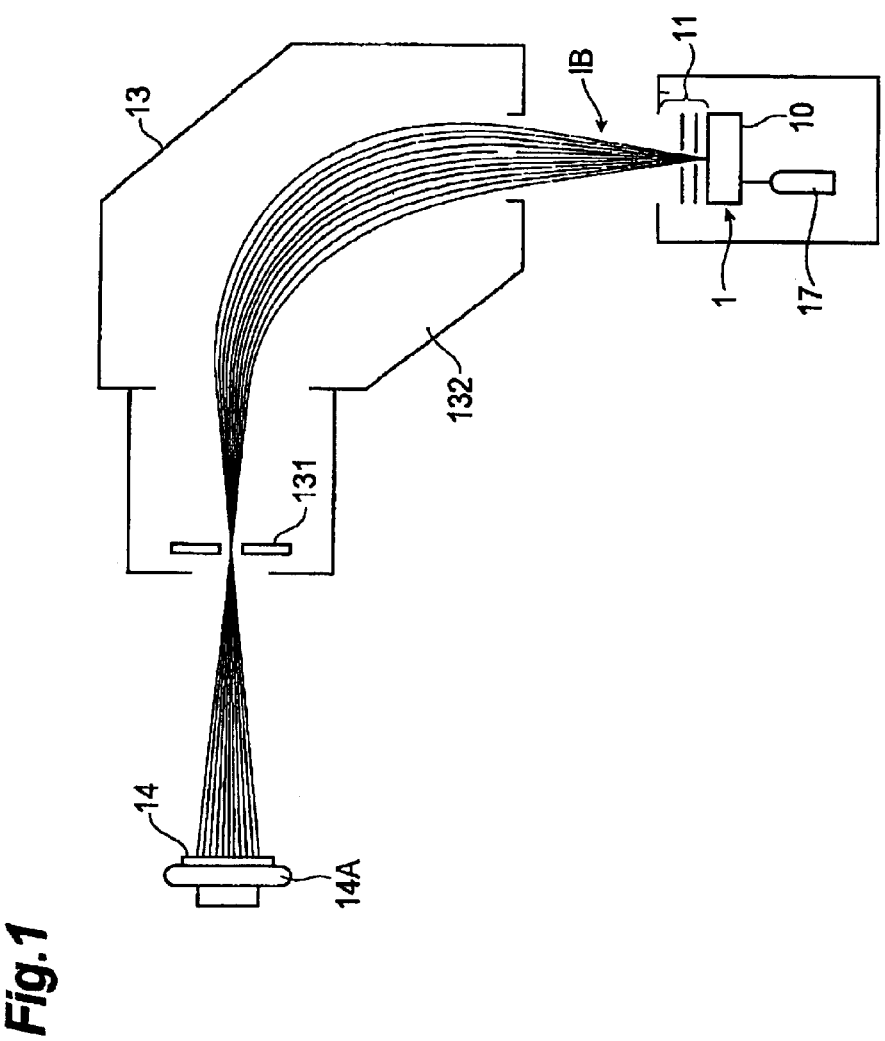
FIG. 1 is an explanatory view schematically showing an example of an ion implantation apparatus.

DESCRIPTION OF THE PREFERRED
EMBODIMENTS

A preferred embodiment of the present invention will be described below in detail with reference to the drawings. Note that, in the drawings, the same reference numerals will be added to the same or equivalent portions, and repeated descriptions will be omitted.

First, an ion implantation method will be described.

FIG. 1 is an explanatory view schematically showing an example of an ion implantation apparatus for use in the present invention. The apparatus shown in FIG. 1 is one provided with the ion extraction assembly 1 including the ion source 10, the tank 17 for supplying hydrogen gas to the ion source 10 and the extraction electrodes 11, with the ion mass selector 13, and with the target substrate folder 14A. The hydrogen ion beams IB from the ion extraction assembly 1 are directed toward the target substrate folder 14A through the ion mass selector 13. In this case, hydrogen molecule ions are selected from the hydrogen ion beams IB passing through the ion mass selector 13, and these hydrogen molecule ions are irradiated onto the target substrate 14 attached onto the target substrate folder 14A.

The ion extraction assembly 1 is one supplying the hydrogen ion beams IB containing the hydrogen molecule ions by use of a microwave. Note that, though the configuration details of the ion source 10 and a light guide path for the microwave are not shown in FIG. 1., these will be described later with reference to FIGS. 2 and 3.

The ion mass selector 13 is provided with the magnetic sector mass analyzer 132 operating together with the mass and the mass selection slit 131. The analyzer 132 contains a magnetic field in a direction perpendicular to the sheet of FIG. 1. In the magnetic field as described above, ion beams containing ions with fixed energy having a predetermined mass/charge ratio start from a point proximate to the exit aperture of the arc chamber of the ion source 10, pass through the entrance and exist apertures of the analyzer 132, and come into a focus on the surface of the mass selection slit 131.

Only beams showing ions with a single mass/charge ratio are drawn in FIG. 1. Therefore, the beams come into a single focus on the aperture of the slit 131, and the beams of the ions with this mass/charge ratio can pass through the slit 131 toward the target substrate 14. Actually, the beams discharged from the ion source 10 also contain ions with a mass/charge ratio different from one desirable in implantation into the substrate 14. These undesirable ions have a curvature radius different from that of desired ions, and do not pass through the slit. The desired ions come into the focus on one point on the surface of the slit 131 by the analyzer 132. Hence, the analyzer 132 has a dispersion surface on the surface of FIG. 1.

Figure 2:
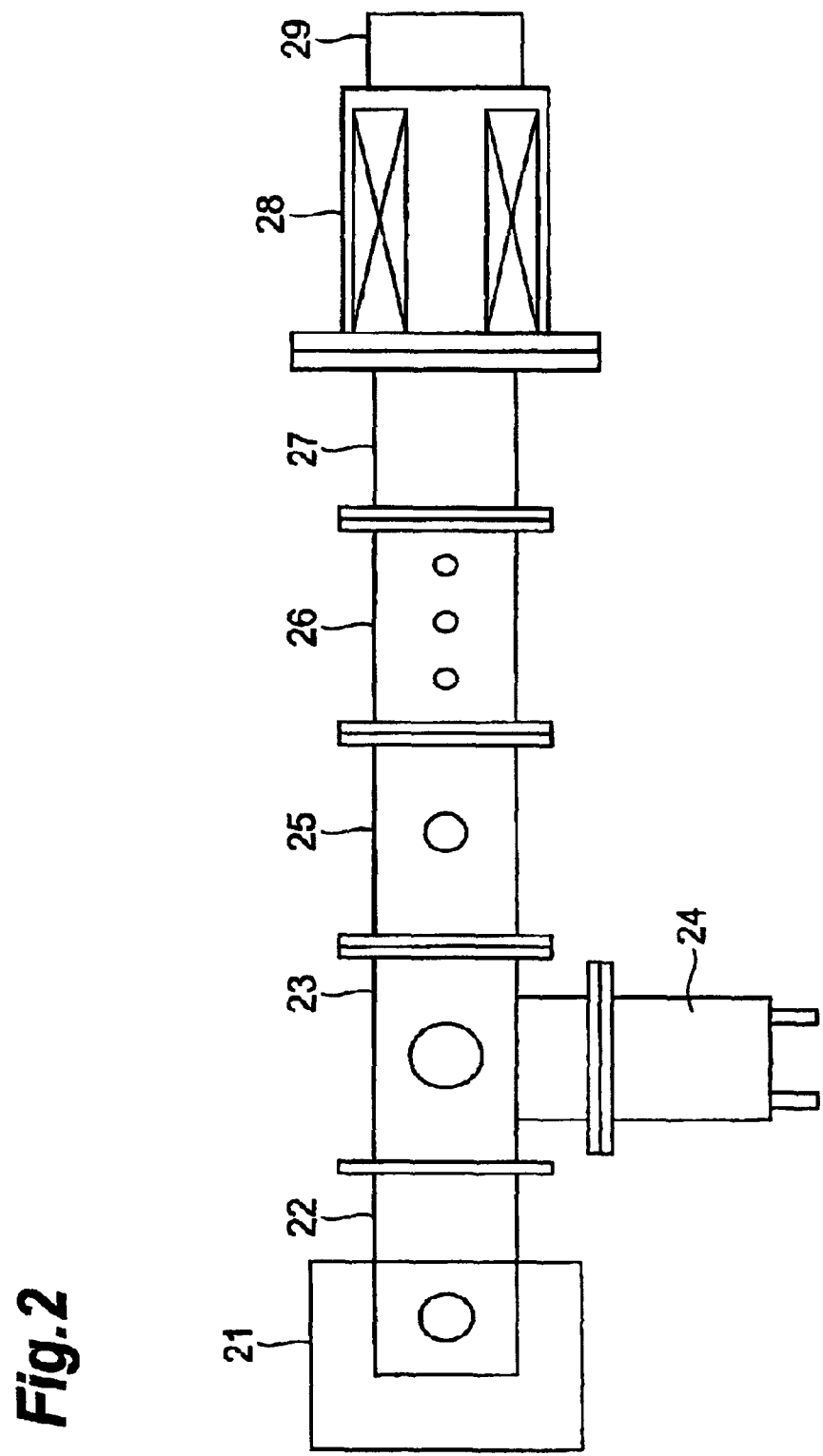
FIG. 2 is a constitutional view schematically showing an example of a microwave ion source.

FIG. 2 is a constitutional view schematically showing an example of a microwave ion source. In FIG. 2, the magnetron 21, the magnetron mount 22, the circulator 23, the power monitor 25, the stab tuner 26, the interface tube 27 and the source head 28 are coupled in this order, and the plasma chamber 29 is provided on the front surface of the source head 28. Moreover, the dummy load 24 is provided on the side portion of the circulator 23.

The magnetron 21 is one generating a predetermined microwave (for example, a microwave of 2.45 GHz). This microwave is introduced into the source head 28 and utilized for the generation of plasma. The circulator 23 is one detouring, to the dummy load 24, a reflected microwave that is going to return to the magnetron 21. The detoured microwave is absorbed into the dummy load 24 and converted into heat. Moreover, the stab tuner 26 is one adjusting the microwave such that a reflection thereof is eliminated and consumption thereof for the plasma generation is increased. Note that the power monitor 25 detecting the output of the microwave and the interface 27 are not essential elements and can be omitted as appropriate.

Figure 3:
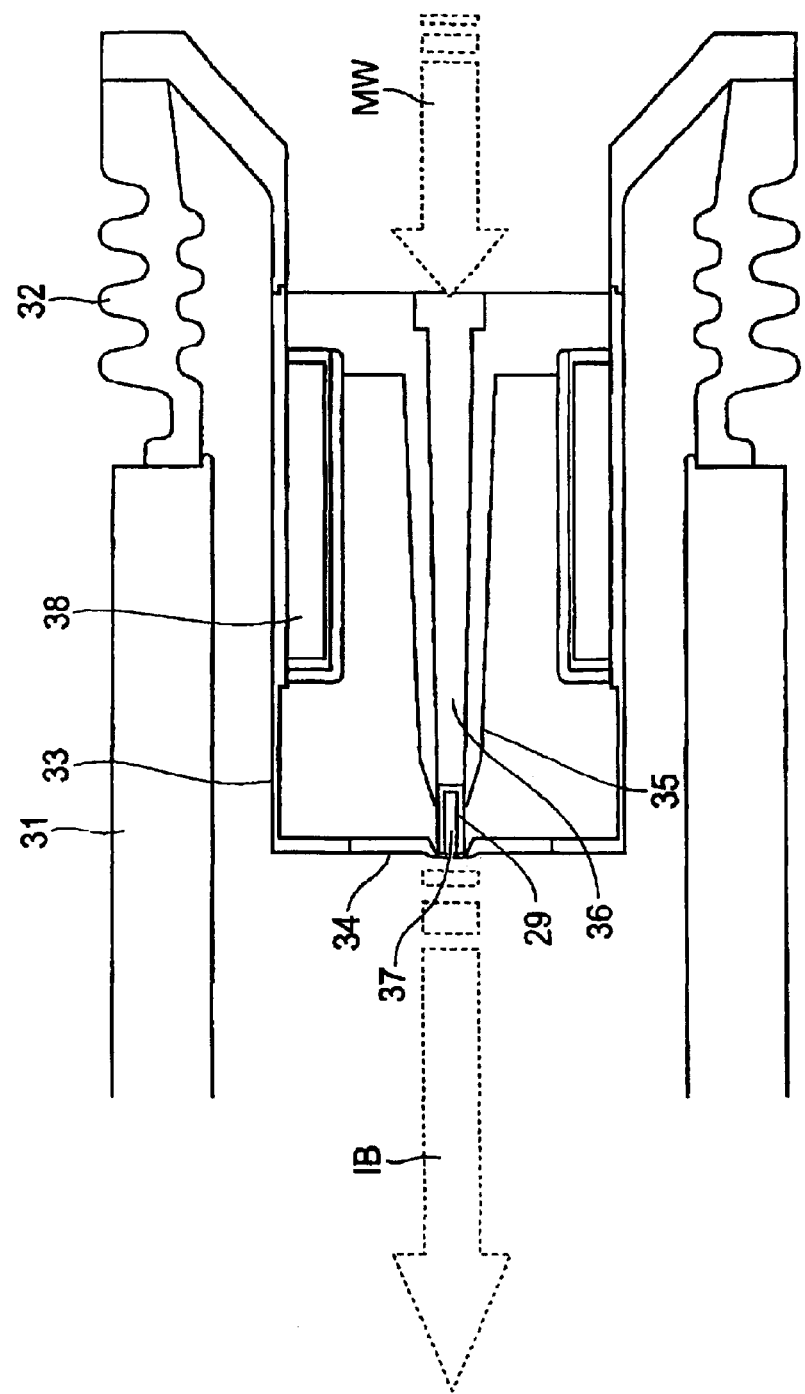
FIG. 3 is a cross-sectional view when a source head is cut on a plane including an introduction path of the microwave.

FIG. 3 is a cross-sectional view when the source head 28 is cut on a plane including the introduction path of the microwave. In FIG. 3, the source bushing 32 is formed on the magnetron side (entrance side of the microwave MW) of the source head outer wall 31, and an end thereof is formed into a shape bent toward the inside of the source head. The magnet yoke 33 is provided on the tip of this bent portion, thus giving a recessed space in the inside of the source head 28. The exit plate 34 having an opening is provided on the front surface of the magnet yoke 33, and the concave plasma chamber 29 is disposed on the opening on the magnetron side of the plate 34. The concave space 37 of the plasma chamber 29 is a plasma generation region, to which the hydrogen gas is supplied.

Moreover, the convex magnet pole 35 is disposed such that a convex tip thereof is proximate to the plasma chamber 29 and a bottom side surface thereof is brought into an tight contact with the inner wall surface of the side portion of the magnet yoke 33. In this magnet pole 35, the waveguide tube 36 is disposed such that the center of the bottom of the magnet pole 35 and the convex tip thereof communicate with each other. This waveguide tube 36 is one introducing the microwave into the plasma chamber 29.

In the space 37 formed of the inner wall surfaces of the magnet yoke 33 and the plate 34 and the outer wall surfaces of the plasma chamber 29 and the magnet pole 35, the solenoid coil 38 is disposed so as to be wound around the convex portion of the magnet pole 35.

In the ion source having the configuration described above, electrons in the magnetic field are subjected to the Lorentz force and gyrate along magnetic flux lines. In this case, when the microwave is introduced into the waveguide tube 36 while introducing the hydrogen gas into the plasma generation region 37, the electrons in the magnetic filed are excited by the microwave, and the plasma containing the hydrogen molecule ions ($H_2^+$) is generated by a collision between the excited electrons and the hydrogen gas in the plasma generation region 37.

Although this plasma generation may be performed by any of the ECR mode and the Off-ECR mode, it is preferable to perform the plasma generation by the Off-ECR mode. The plasma generation by the Off-ECR mode makes it possible to enhance the generation efficiency of the hydrogen molecule ions by low-energy electrons and the plasma density and to further improve the current density of the hydrogen ion beams IB and the ratio of the hydrogen molecule ions therein.

Note that the ECR (Electron Cyclotron Resonance) mode described here is one to be described as follows. At the ECR mode, the frequency of the microwave is made to coincide with an electron cyclotron frequency (frequency of the electrons gyrating along the magnetic flux lines) represented in the following Expression (4):

$$\omega = \frac{eB}{2\pi m_e} \approx 2.80B \times 10^{10} \text{ [Hz]} \quad (4)$$

where $\omega_o$ is an electron cyclotron frequency, $m_e$ is a mass of electrons, e is a charge of the electrons, and B is an intensity of the magnetic field, through which the electrons are selectively excited in an electron cyclotron resonance/absorption process, and the excited electrons and the hydrogen molecules are made to collide with each other, thus generating the plasma. However, if the plasma is generated at the ECR mode, then the hydrogen atom ions ($H^+$) are apt to be generated, and the current density of the hydrogen ion beams are apt to be insufficient.

Meanwhile, the Off-ECR mode is one, at which the plasma is generated so as not to satisfy the ECR conditions, that is, such that the frequency of the microwave and the intensity of the magnetic field satisfy conditions represented by the following Expression (5) or (6):

$$\omega > \frac{eB}{2\pi m_e} \quad (5)$$

$$\omega < \frac{eB}{2\pi m_e} \quad (6)$$

where $\omega$ is a frequency of a microwave, $m_e$ is amass of electrons, e is a charge of the electrons, and B is an intensity of the magnetic field.

Note that, in the case of setting the Off-ECR mode, the intensity of the magnetic field may be adjusted while fixing the frequency of the microwave, or the frequency of the microwave may be adjusted while fixing the intensity of the magnetic field.

In the Of f-ECR mode, it is preferable that the frequency of the microwave and the intensity of the magnetic field be set such that the frequency $\omega$ of the microwave is higher (or lower) than the electron cyclotron frequency $\omega_e$ by 10 to 50% (more preferably, 20 to 40%). Hence, in the case of using a microwave of 2.45 GHz for example, it is preferable that the intensity of the magnetic field range from 96 to 131 mT or from 44 to 79 mT (more preferably, from 105 to 123 mT or from 53 to 70 mT). In addition, in the case of using a microwave of 14.5 GHz, it is preferable that the intensity of the magnetic field range from 570 to 777 mT or from 259 to 466 mT.

Moreover, a mean residential time of the hydrogen molecules from the introduction of the hydrogen gas into the plasma generation region 37 to the extraction of the hydrogen ion beams IB ranges preferably from $5\times10^{-4}$ to $5\times10^{-3}$, and more preferably, from $7\times10^{-4}$ to $3\times10^{-3}$ seconds. If the mean residential time exceeds the upper limit value described above, then, as a tendency, the ratio of the hydrogen molecule ions is lowered. On the other hand, if the mean residential time is lowered than the lower limit value described above, then, as a tendency, the generation efficiency of the plasma is lowered. The mean residential time can be set by adjusting the shape and size Of the plasma chamber 29, the supply amount of the hydrogen gas, the extraction amount of the hydrogen ion beams IB and the like.

The hydrogen ion beams IB containing the hydrogen molecule ions thus generated are extracted from the plasma chamber 29, and in the ion mass selector 13, the hydrogen molecule ions are selected from the hydrogen ion beams IB. The irradiation of the hydrogen molecule ions onto the target substrate 14 makes it possible to efficiently form a sufficient amount of hydrogen ion implanted layer to a predetermined depth of the target substrate.

As the target substrate, a semiconductor substrate such as a Si substrate, one in which an insulating layer such as a $SiO_2$ layer is formed on one surface of the semiconductor substrate, or the like is suitably used. For example, in the case of using a semiconductor substrate having a layered structure of $SiO_2$ layer/Si substrate, the hydrogen ion implanted layer is formed in the Si substrate by irradiating the hydrogen molecule ions from the side of the $SiO_2$ layer. Then, as the hydrogen ion implanted layer is being formed, a thin Si layer is formed between the $SiO_2$ layer and the hydrogen ion implanted layer.

Note that, in the conventional method using the arc discharge type ion source, the RF ion source and the like, the hydrogen atom ions are more apt to be generated than the hydrogen molecule ions, and therefore, the hydrogen atom ions have been utilized exclusively in the ion implantation. On the other hand, in the ion implantation method of the present invention, the plasma generation is performed by use of the microwave, and thus, the ratio of the hydrogen molecule ions in the plasma can be dramatically increased in comparison with the case of using the arc discharge type ion source, the RF ion source and the like. Accordingly, the hydrogen molecule ions can be effectively utilized in the ion implantation.

For example, the inventors of the present invention have confirmed that an ion composition of: 13.5% $H^+$ ions; 78.1% $H_2^+$ ions; and 8.4% $H_3^+$ ions was achieved when the plasma was generated by setting the mean residential time of the hydrogen molecules at $8.9\times10^{-4}$ seconds in an Off-ECR mode in which the frequency of the microwave was 2.45 GHz, the output of the microwave was 700 W, and the intensity of the magnetic field was 70 mT. On the contrary, an ion composition of plasma generated by the conventional arc discharge type ion source was of: 60.2% $H^+$ ions; 22.9% $H_2^+$ ions; and 16.9% $H_3^+$ ions.

Next, a method for manufacturing an SOI wafer will be described in detail by taking, as an example, the case of manufacturing an SOI wafer having a layered structure of Si layer/$SiO_2$ layer/Si substrate.

FIGS. 4A to 4D are cross-sectional views schematically showing layered structures of a wafer in respective steps.

In the ion implantation process, as the target substrate, one in which the $SiO_2$ layer 42 is formed on one surface of the Si wafer (Si-donor wafer) 41 is used. It is possible to form the $SiO_2$ layer 42 by, for example, oxidizing the surface of the Si-donor wafer. The thickness of the $SiO_2$ layer 42 ranges, for example, from 0.01 to 1.0 μm.

The hydrogen molecule ions are irradiated onto this target substrate from the $SiO_2$ layer 42 side of the wafer, whereby the hydrogen ion implanted layer 43 is formed to the predetermined depth of the Si substrate 42, followed by the formation of the thin Si layer between the $SiO_2$ layer 42 and the hydrogen ion implanted layer 43.

In the ion implantation process, it is preferable to generate the hydrogen ion beams by the Off-ECR mode as described above. Thus, an extremely high through put becomes realizable, and consequently, the manufacturing efficiency of the SOI wafer can be dramatically improved. The inventors of the present invention have confirmed that the manufacturing efficiency of the SOI wafer in the case of performing the ion implantation by the Off-ECR mode can be enhanced to no less than four times as high as that in the case of the conventional manufacturing method using the arc discharge type ion source, the RF ion source and the like.

It is preferable that the ion implantation amount in the ion implantation process be $1\times10^{16}$ ion/cm$^2$. In addition, the hydrogen ion implanted layer 43 is formed, for example, in a position of a depth of 0.005 to 1.5 μm from an interface between the Si layer 44 and the $SiO_2$ layer 42.

Figure 4A:
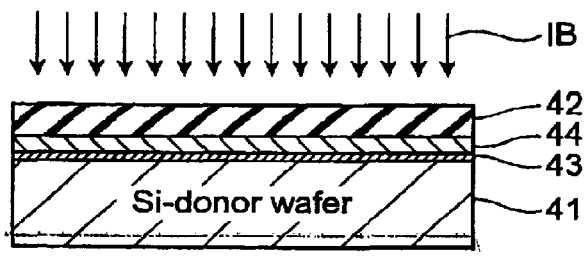
FIGS. 4A to 4D are cross-sectional views schematically showing layered structures of a wafer in respective steps.
Figure 4B:
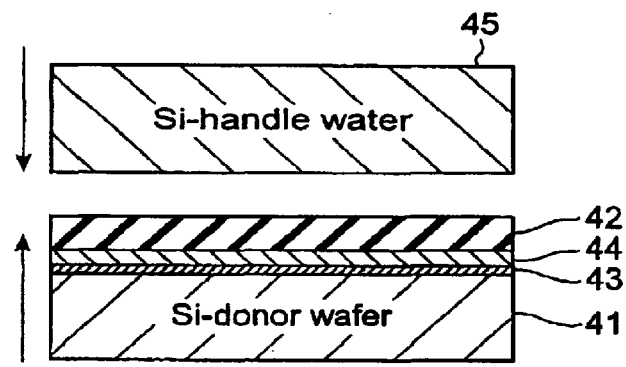

Next, the Si wafer (Si-handle wafer) 45 is bonded onto the $SiO_2$ layer 42 of the target substrate (FIG. 4B). Note that the target layered body can also be obtained in the following manner. While an ion implantation process similar to the above is performed for a Si substrate on which the $SiO_2$ layer is not formed, a Si substrate in which the $SiO_2$ layer is formed on a surface is prepared, and both of them bonded together in a layering process.

Figure 4C:
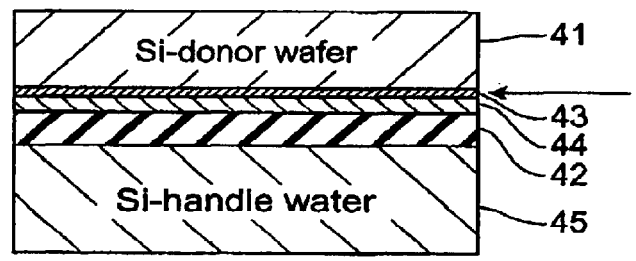

This layered body is partitioned at the hydrogen ion implanted layer 43 (FIG. 4C). The hydrogen ion implanted layer 43 is a fragile layer in which the covalent bonds of the silicon atoms are cut. Therefore, the hydrogen ion implanted layer 43 can be cut-easily by blowing gas such as dry air to the side surface of the hydrogen ion implanted layer 43 and mechanically shearing the same.

Figure 4D:
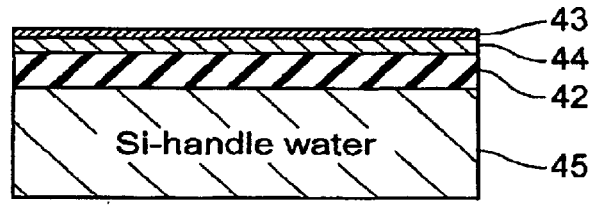

In such a way, the SOI wafer in which the $SiO_2$ layer 42 and the Si layer 44 are layered on the Si substrate 45 in this order can be obtained (FIG. 4D). Note that, though a part of the hydrogen ion implanted layer 43 remains on the surface of Si layer 44 after the partition process in some cases, the residual can be removed easily by performing a polishing process and the like. Moreover, the thickness of the Si layer 44 can be adjusted by polishing the Si layer 44 further.

As described above, according to the ion implantation method of the present invention, the hydrogen ion beams, in which the ratio of the hydrogen molecule ions are high and the current density is high, are extracted, and the hydrogen molecule ions from the hydrogen ion beams are irradiated onto the semiconductor substrate, thus making it possible to implant the hydrogen ions to the predetermined depth of the semiconductor substrate.

Moreover, according to the method for manufacturing an SOI wafer of the present invention, the ion implantation method described above of the present invention is applied in the ion implantation process, thus making it possible to realize the throughput at a high level. In addition, the SOI wafer excellent in integration can be manufactured efficiently and securely.

What is claimed is:

1. An ion implantation method for implanting hydrogen ions to a predetermined depth of a semiconductor substrate, comprising steps of:

introducing hydrogen gas into a chamber where an inner pressure is reduced and a predetermined magnetic field is formed;

generating plasma by introducing a microwave into the magnetic field;

extracting hydrogen ion beams containing hydrogen molecule ions from the plasma; and irradiating the hydrogen molecule ions onto the semiconductor substrate.

2. The ion implantation method according to claim 1, wherein a frequency of the microwave and an intensity of the magnetic field satisfy conditions represented by any of following expressions:

$$\omega > \frac{eB}{2\pi m_e}$$

$$\omega < \frac{eB}{2\pi m_e}$$

where $\omega$ is the frequency of the microwave, $m_e$ is a mass of electrons, e is a charge of the electrons, and B is the intensity of the magnetic field.

3. The ion implantation method according to claim 1, wherein a mean residential time of hydrogen molecules from the introduction of the hydrogen gas into a generation region of the plasma to the extraction of the hydrogen ion beams ranges from $5 \times 10^{-4}$ to $5 \times 10^{-3}$ seconds.

4. The ion implantation method according to claim 1, wherein one including an insulating layer on a Si substrate is used as the semiconductor substrate, and the hydrogen molecule ions are implanted to a predetermined depth of the Si substrate by irradiating the hydrogen molecule ions from a side of the insulating layer.

5. The ion implantation method according to claims 1, wherein one including a $SiO_2$ layer on the Si substrate is used as the semiconductor substrate, and the hydrogen molecule ions are implanted to a predetermined depth of the Si substrate by irradiating the hydrogen molecule ions from a side of the $SiO_2$ layer.

6. A method for manufacturing an SOI wafer, comprising:

an ion implantation step of forming a hydrogen ion implanted layer to a predetermined depth of a first wafer having an insulating layer on one surface of a Si substrate by the ion implantation method according to claim 1;

a layering step of obtaining a layered body by layering a second wafer formed of a Si substrate on the insulating layer of the first wafer having been subjected to the ion implantation step; and a partition step of partitioning the layered body at the hydrogen ion implanted layer.

7. The method for manufacturing an SOI wafer according to claim 6, wherein the insulating layer is a $SiO_2$ layer.

8. A method for manufacturing a SOI wafer, comprising:

an ion implantation step of forming a hydrogen ion implanted layer to a predetermined depth of a third wafer formed of a Si substrate by the ion implantation method according to claim 1;

a layering step of obtaining a layered body by layering an insulating layer and a second wafer formed of a Si substrate on a predetermined surface of the third wafer having been subjected to the ion implantation step; and a partition step of partitioning the layered body at the hydrogen ion implanted layer.

9. The method for manufacturing an SOI wafer according to claim 8, wherein the insulating layer is a $SiO_2$ layer.

* * * * *